United States Patent [19]

Schmeckenbecher

[11] 4,260,451
[45] Apr. 7, 1981

[54] METHOD OF REWORKING SUBSTRATES, AND SOLUTIONS FOR USE THEREIN

[75] Inventor: Arnold F. Schmeckenbecher, Poughkeepsie, N.Y.

[73] Assignee: International Business Machines Corp., Armonk, N.Y.

[21] Appl. No.: 130,669

[22] Filed: Mar. 17, 1980

[51] Int. Cl.$^3$ .............................................. C23F 1/00
[52] U.S. Cl. ................................. 156/664; 156/656; 252/79.1
[58] Field of Search ............... 156/656, 664; 252/79.1, 252/79.2, 79.3; 134/3, 41

[56] References Cited

U.S. PATENT DOCUMENTS

| | | | |
|---|---|---|---|
| 3,634,159 | 1/1972 | Croskery | 252/79.2 X |
| 4,190,489 | 2/1980 | Bahl et al. | 156/664 |

OTHER PUBLICATIONS

IBM Technical Disclosure Bulletin, vol. 10, No. 4, Sep. 1967, Etch for Removing Gold by R. Flitsch, p. 355.

*Primary Examiner*—William A. Powell
*Attorney, Agent, or Firm*—Wolmar J. Stoffel

[57] ABSTRACT

A solution for dissolving noble metal alloys which include tin, and other metals commonly used in semiconductor package substrates, having significant concentrations of KI, iodine and halogen ions selected from the group consisting of chloride and bromide ions.

10 Claims, No Drawings

METHOD OF REWORKING SUBSTRATES, AND SOLUTIONS FOR USE THEREIN

DESCRIPTION

1. Technical Field

This invention relates to the dissolution of metal, and more particularly to the dissolution of metallic deposits in operations for reclaiming substrates of semiconductor packages, more particularly to the dissolution of noble metal alloys which include tin from ceramic substrates, having included thereon refractory metal features which must be retained.

In the semiconductor industry, the support elements for integrated circuit semiconductor devices commonly referred to as packages, are necessarily becoming larger and more complex to take advantage of the great density and speed of operation of modern integrated circuit semiconductor devices. In order to achieve the circuit density and desirable operating characteristics necessary for compatible package structures to connect and interconnect highly integrated semiconductor devices, the substrate supporting the device or devices must have a very dense wiring structure. A known structure for achieving this density is known as a multilayer ceramic substrate. Multilayer ceramic substrates are well known as indicated by an article entitled "A Fabrication Technique for Multilayer Ceramic Substrates" by H. D. Kaiser, et al in Solid State Technology, May 1972 Pages 35-40. In this technology green sheets of ceramic, i.e., ceramic powder held together in sheet form by temporary organic binders, are metallized with noble or refractory metals, usually by screen printing. The green sheets are stacked, laminated, and fired to form a monolithic ceramic package. This technology offers an opportunity to do three-dimensional wiring in what was formerly waste or inaccessible space in a solid ceramic substrate. This use of what was formerly wasted space results in the creation of the high density, sturdy electronic package with good performance and reliability.

As would be expected, the cost of fabricating packages that embody multilayer ceramic substrates is greater by orders of magnitude than the cost of the usual package which utilize solid ceramic substrates with only a single top surface metallurgy layer. By the time that the multilayer ceramic substrate is ready to have devices mounted thereon a very significant investment has been made. The substrate is no longer a throwaway item.

A particularly attractive technique for connecting integrated circuit devices to MLC substrates is solder bonding, as described and claimed in U.S. Pat. No. 3,429,040 and U.S. Pat. No. 3,495,133. While the solder bonding technology is highly developed, and is considered very reliable, an occasional defective solder bond can occur. With a multilayer ceramic substrate supporting 100 devices, with each device provided with between 100 and 200 solder pad terminals, between 10,000 to 20,000 solder joints are required to interconnect the devices. Only a single defective joint will render the package unacceptable for use. The aforementioned relatively high cost of the multilayer ceramic module in the semiconductor package makes efforts to salvage and repair defective modules economically feasible, particularly modules that have defective solder bonds. To salvage or rework the module with one or more defective bonds which show up when the module is tested, the cover is removed, the devices removed, and the top surface metallurgy cleaned and restored. When the cover, pins and devices are removed, excess metal, such as lead-tin solder, gold-tin braze material, nickel, etc. remains, which must be removed. This, most desireably, is accomplished with an etchant solution. However, the etchant solution used must not adversely affect the ceramic substrate or the basic metallurgy of the substrate, usually a refractory metal.

This rework method and the solution used therein is adapted to efficiently and effectively remove excess metal commonly used on a multilayer ceramic substrate without adversely affecting the basic metallurgy system of the substrate which must be retained.

2. Brief Description of Invention

It is an object of this invention to provide a new solution for selectively stripping metals from a substrate.

Another object of this invention is to provide a solution for removing tin and tin alloys while not significantly affecting refractory metals and ceramic materials.

An object of this invention is to provide a new process for reworking semiconductor packages.

another object of this invention is to provide a new process for reworking semiconductor packages in which a solution is used for removing tin, tin alloys, nickel, etc. coatings without significantly affecting refractory metals and the ceramic material of the substrate of the package.

In accordance with the aforementioned objects, there is provided a solution for dissolving noble metal alloys and other conductive metals commonly used on a semiconductor package in presence of refractory metals which must be retained wherein the solution consists essentially of KI, Iodine, and a concentration of ions selected from the group consisting of fluoride, chloride and bromide ions. There is also provided a rework method of removing from a substrate, features formed of noble metal alloys containing tin, and other conductive metals normally used on substrates in presence of refractory metals which must be retained on the substrate. The process involves subjecting the substrate to the action of a solution consisting essentially of potassium iodide, iodine, and ions selected from the group consisting of chloride and bromide ions.

DESCRIPTION OF PREFERRED EMBODIMENTS

In the practice of the invention, a potassium iodide-iodine solution which also includes halogen ions other than iodide ions, is used as an etchant to remove various metals from a substrate, in particular the substrate of a semiconductor device package. While the etchant solution of the invention can be used for any suitable purpose, it is particularly adapted for reworking faulty metallurgy on substrates that are too expensive to discard in the event that a correctable defect is present. An example of such package substrates are multilayer ceramic (MLC) substrates with internal metallurgy that is used to interconnect a plurality of devices mounted on the top surface and providing I/O connections on the bottom or sides of the substrate. Multilayer ceramic substrates are relatively well known and are formed by forming green ceramic sheets of ceramic particles mixed with a suitable vehicle, punching holes in the sheets and depositing conductive metallurgy in the holes and also on the surfaces to form interconnecting lines, assembling the sheets to form a composite substrate with internal circuitry, and subsequently sintering the assembly to burn off the vehicle leaving the ceramic particles and metallurgy. In such substrates complex metallurgy systems are provided on the top surface to join the semiconductor devices and also to provide a seal with an enclosure. A common technique for joining the semiconductor devices to the substrate is through the use of solder bonds. In practice, a single device can have several hundred solder pads which are joined to corresponding pads on the MLC substrate. The metallurgy used to make the solder connection to the semiconductor devices is relatively complex and consists normally of pads on the substrate formed of a refractory metal which will withstand the high temperatures necessary for sintering the module. Since the refractory metal pads are not solder wettable, additional metal layers are deposited on the refractory metal pads to provide a solder wettable surface. For example, a nickel layer can be deposited on the refractory metal pads which will present a surface that is solder wettable. Solder material can then be deposited either on the substrate or on the device and heated to make the solder connection. In addition, the devices on the substrate are protected by a hermetically sealed cap. The cap is desirably secured to the substrate by brazing to an annular refractory metal layer provided with a nickel coating. The cap can be joined to the substrate by brazing with an alloy of tin and gold. The selection of the proper alloys used to braze the cap to the substrate is critical since the heating in successive process steps, such as joining the cap to the substrate joining the pins, and joining the devices, must be done at increasingly lower temperatures. I/O pins on the substrate are mounted on the back side of the substrate using refractory metal pads coated with nickel and brazed using a gold-tin alloy. When a defective bond or seal occurs the cap must be removed, the defective device removed, and the metallurgy cleared to allow repair of the device connection. This necessitates the removal of noble metal alloys, in particular gold-tin, nickel layers, and lead-tin alloys. The same problem occurs if pins or other I/O connections must be removed or reworked. In removing the metallurgy layers, it is important that the refractory metal pads on the substrate be preserved. However, all metallurgy above the refractory metal pad should be removed.

IBM Technical Disclosure Bulletin Vol. 18 No. 2 July 1975 P. 413 discloses the use of an iodine-iodide solution for removal of various plated layers during reworking of multilayer ceramic substrates. However, this solution is not satisfactory when the metallurgy includes noble metal alloys which include tin. When tin is present, it has been discovered that a protective layer is formed by the reaction of iodine with tin that is water insoluble and prevents any further etching action. It has been discovered that the addition of chloride or bromide ions to iocine-iodide solutions makes possible a clean surface wherein the metallurgy is removed and further the solution does not adversely affect the refractory metal pads on the substrate which must be preserved.

The iodine-iodide solution with chloride or bromide ions added thereto etch the metal by the following reactions. With gold the overall reaction is as follows; although other species may form intermediately:

$$3I_2 + 2I^- + Au° \rightarrow 2[AuI_4]^- \text{(water soluble)}$$

With tin, an iodine-iodide solution without chloride or bromide ions yields the following overall reaction:

$$2I_2 + Sn° \rightarrow SnI_4 \text{(water insoluble)}$$

The tin iodide product is water insoluble and prevents further etching action of the tin. However, when chloride (or bromide) ions are added to the iodine-iodide solution, the following or a similar overall reaction occurs.

$$I_2 + 2I^- + 2Cl^- + Sn° \rightarrow SnCl_2I_2 \cdot H_2O \text{(water soluble)}$$

The reaction product(s), such as $SnCl_2 I_2 \cdot H_2O$, is water soluble which permits continued etching action of tin. With molybdenum, which is a refractory metal, the reaction yields a water insoluble compound, such as the following or a similar sequence of reactions:

$$I_2 + 2I^- + 4Cl^- + 3Mo \rightarrow Mo_3Cl_4I_2 \cdot 3H_2O$$

The product $MoCl_4I_2 \cdot 3H_2O$ is decomposed by water into a water insoluble compound that protects the molybdenum pad from any further reaction from the solution which would be adverse to the pad surface.

The preferred solution for practicing the invention is an acqueous solution having potassium iodine present in an amount at least 0.3 moles/liter (50 gr/liter), preferably in the range of 0.60 moles/liter (100 g/l) to 3.6 moles/liter (600 g/l), most preferably from 1.5 moles/liter (250 g/l) to 2.1 moles/liter (350 g/l), iodine in an amount at least 0.195 moles/liter, more preferably in a range of 0.39 moles/liter (100 g/l), to 2.4 moles/liter (600 g/l) most preferably in the range of 0.98 moles/liter (250 g/l) to 1.75 moles/liter (350 gr/liter) and halogen ions selected from the group consisting of chloride and bromide ions in an amount in the range of 0.75 moles/liter to 4.0 moles/liter, more preferably from 1.0 moles/liter to 1.75 moles/liter.

In the process of the invention, the article being reworked i.e., the semiconductor substrate, is immersed in the aforedescribed solution for a time necessary to remove the various layers of metal leaving the refractory metal pads intact. Preferably, the temperature of the solution is in the range of 65° C. to 80° C. The time necessary to remove the metallurgy varies with the thickness of the layers. Normally an immersion on the order of 20 to 90 minutes is sufficient.

It has been discovered that fluoride ions can be used with the iodide-iodine solution with the same basic result as obtained by the addition of chloride and bromide ions. However, this embodiment is useful when the substrate is of a material other than glass or ceramic. The fluoride ions, when present, erode the glass or ceramic material. Combinations of chloride and bromide or fluoride ions can also be used.

The following examples are included to enable one to perform preferred specific embodiments of the invention and are not intended to limit the scope of protection provided for by the claims.

EXAMPLE I

In this example, and also in the following examples, the etch rate of an 80/20 gold-tin alloy was determined for various concentrations of the solution of the invention, at different temperatures, and comparisons made to potassium iodide-iodine solutions which include various chloride and bromide additives. The specimens being etched were flat strips of metal that were each 2" long, ½" wide and 0.005" in thickness. The strips were formed of an alloy of 80% gold and 20% tin. The following solutions were prepared, all of which include an HCL additive.

| KI | $I_2$ | HCL | Etch Rate |
| --- | --- | --- | --- |
| 1. 600 g/l | 150 g/l | 100 ml/l | 140 microinches/min. |
| 2. 300 g/l | 300 g/l | 100 ml/l | 511 microinches/min. |
| 3. 600 g/l | 600 g/l | 100 ml/l | 384 microinches/min. |
| 4. 120 g/l | 120 g/l | 100 ml/l | 142 microinches/min. |

The aforedescribed alloy strips were immersed in each of the aforedescribed solutions. Prior to immersion in the solution, the strip was carefully weighed, the strip immersed for approximately 2 minutes in the etchant and subsequently weighed again. The weight loss was recorded and the etch rate computed, neglecting the surface area along the edges. The temperature of the etchant solution was maintained at 75° C. The etch rates of the solutions are indicated in the last column. An inspection of the surface of the strip indicated a clean, bright surface, with the appearance of gold.

EXAMPLE II

The same procedure was followed in this example except that the solution consisted of 600 g/l KI, 150 g/l of $I_2$ with no additives. With the temperature of the solution at 50° C., the etch rate was 2.3 microinches/min. An inspection of the strip exposed to the solution indicated a relatively thin, dull coating with a tarnished bronze appearance. A second solution having the same components, but maintained at a temperature of 75° C. exhibited an etch rate of 6.2 microinches/min. A comparison of the rates with those of Example 1 indicates the very marked increase obtained by the use of chlorine additives. The appearance of the etched strips was again similar to the previous etched strip.

EXAMPLE III

The following iodine-iodide solutions were prepared with the indicated additives.

| KI | $I_2$ | Additive | Etch Rate |
| --- | --- | --- | --- |
| 1. 300 | 300 | 92 g/l of KCl | 554 microinches/min. |
| 2. 150 | 600 | 92 g/l of KCl | 221 microinches/min. |
| 3. 300 | 300 | 124 NaBr | 139 microinches/min. |

The same procedure described in Example I was followed with the solutions being maintained at 75° C. during the immersion of the strips. The calculated etch rates are listed in the last column. As the etch rates for the respective solutions indicate, the critical element is the additives, i.e., chloride or bromide ions and not the concentration of the hydrogen ions. The basic difference between the additives set forth in Example I and Example III is the presence of an acid to introduce the halogen ions.

EXAMPLE IV

The following solutions were prepared:

| KI | $I_2$ | Additive | Etch Rate |
| --- | --- | --- | --- |
| 1. 300 | 300 | 132 ml/l of HI | 3.2 microinches/min. |
| 2. 300 | 300 | 264 ml/l of HI | 2.2 microinches/min. |

The same procedures described in Example I were used to determine the etch rate of the aforedescribed solutions. As the etch rates indicate, additional iodide ions do not increase the etch rate. An inspection of the etched strips indicated a dull irregularly colored surface coating having the appearance of tarnished bronze.

EXAMPLE V

The following solutions were prepared:

| KI | $I_2$ | Additive | Etch Rate |
| --- | --- | --- | --- |
| 1. 300 | 300 | 100 ml/l of acetic acid | 17.3 microinches/min. |
| 2. 300 | 300 | 40 g/l NOAH | 84.3 microinches/min. |
| 3. 300 | 300 | 100 ml/l of $H_2SO_4$ | 1.3 microinches/min. |

The strips were etched in the solutions maintained at 75° C. Both acedic and basic solutions that did not include chlorine or bromide ions were added to the basic iodide-iodine solutions. It is noted that the etch rates were relatively low without bromide or chloride ions. The etched strips all had a dull irregularly colored surface coating having the appearance of tarnished bronze.

This Example indicates that the addition of an acid or a base to the iodine/iodide solution as an additive does not significantly influence the etch rate.

EXAMPLE VI

The following solution was prepared:

| KI | $I_2$ | Additive | Etch Rate |
| --- | --- | --- | --- |
| 1. 0 | 300 | 92 g/l KCL | 2.5 microinches/min. |

The solution was maintained at 75° C. during the etching operation. The same procedure described in Example I was used to determine the etch rate. As the etch rate indicates, the addition of the chloride ion to an iodine solution without iodide ion component does not produce the rapid etching action of the solutions produced in accordance with applicant's invention.

EXAMPLE VII

In this Example, two multi-chip multilayer ceramic modules were stripped of their metallization down to the refractory metal pads to determine the feasibility of the stripping process of the invention. The modules each had a plurality of Kovar I/O pins brazed to molybdenum pads on the bottom surface. The brazing joint consisted of a nickel layer over the surface of molybdenum pads and an 80/20 gold-tin braze material disposed between the nickel layer and the heads of the pins. On the top side of the module there was an annular molybdenum stripe about the periphery with an overlying layer of nickel, and a brazing alloy of 80/20 gold-tin. This strip was used to join the cap to the module. Also on the top side were a plurality of solder pads joined to semiconductor devices by solder bonds. The solder pads also included a layer of nickel and lead/tin solder. The cap and the devices had previously been removed. The aforedescribed module was heated on a hot plate to a temperature of approximately 350° C. The I/O pins are removed by wiping the bottom surface with a ceramic blade. The module was allowed to cool and subsequently immersed for 70 minutes in a preferred embodiment solution of the invention maintained at a temperature of 75° C. The solution consisted of 300 g/l of iodine, 300 g/l of potassium iodine and 100 ml/l of hydrochloric acid. After 70 minutes of immersion the substrate was removed and rinsed in hot tap water. Following the rinse, the substrate was subjected to a vapor blast and inspected. An inspection revealed that the solder, the gold/tin braze material, and the nickel layers overlying the molybdenum pads were completely removed. The surface of the ceramic substrate and the surfaces of the molybdenum pads were clean and showed no adverse errosion. Scanning Electron Microscope Energy Dispersive X-Ray (SEM E.D. X-Ray) analysis detected no residual impurities on either of the two substrates etched in the test.

While we have illustrated and described the preferred embodiments of our invention, it is to be understood that we do not limit ourselves to the precise construction herein disclosed and the right is reserved to all changes and modifications coming within the scope of the invention as defined by the appendant claim.

I claim:

1. A solution for dissolving noble metal alloys which include Sn from substrates in presence of refractory metal which must be retained on the substrate consisting essentially of (1) KI in an amount of at least 0.3 moles/liter, (2) $I_2$ in an amount of at least 0.195 moles/liter, and (3) halogen ions selected from the group consisting of chloride and bromide ions in an amount of at least 0.3 moles/liter.

2. The solution of claim 1 wherein said KI is present in an amount in the range of 0.6 to 3.6 moles/liter, said iodine is present in the range of 1.5 to 2.1 moles/liter, and said halogen ions are present in an amount in the range of 0.75 to 4.0 moles/liter.

3. The solution of claim 1 wherein said KI is present in an amount in the range of 1.5 to 2.1 moles/liter, said iodine is present in the range of 0.98 to 1.36 moles/liter, and said halogen ions are present in an amount in the range of 1.0 to 1.75 moles/liter.

4. The solution of claim 2 wherein said halogen ions are chloride ions.

5. The solution of claim 2 wherein said halogen ions are bromide ions.

6. A re-work method of removing from a substrate features formed of noble metal alloys containing Sn while having features formed of refractory metals intact comprising subjecting the substrate to the action of a solution consisting essentially of
   (1) KI in an amount in the range of 0.6 to 3.6 moles/liter,
   (2) Iodine in an amount in the range of 1.5 to 2.1 moles/liter,
   (3) Halogen ions selected from the group consisting of chloride and bromide ions in an amount in the range of 0.75 to 4.0 moles/liter.

7. The re-work method of claim 6 wherein KI is present in said solution in an amount in the range of 1/5 to 2.1 moles/liter, said iodine in an amount in the range of 0.98 to 1.36 moles/liter, and said halogen ions in an amount in the range of 1.0 to 1.75 moles/liter.

8. The re-work method of claim 6 wherein said halogen ions are chloride ions.

9. The re-work method of claim 6 wherein said halogen ions are bromide ions.

10. The re-work method of claim 6 wherein the temperature of said solution is in the range of 65 to 80° C.

* * * * *